United States Patent
Yang et al.

(12) 
(10) Patent No.: US 6,596,586 B1
(45) Date of Patent: Jul. 22, 2003

(54) METHOD OF FORMING LOW RESISTANCE COMMON SOURCE LINE FOR FLASH MEMORY DEVICES

(75) Inventors: Nian Yang, San Jose, CA (US); Un Soon Kim, Santa Clara, CA (US); Zhigang Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/152,747

(22) Filed: May 21, 2002

(51) Int. Cl.[7] ............................................. H01L 21/336
(52) U.S. Cl. ..................... 438/257; 438/259; 438/262
(58) Field of Search ................................. 438/389–391, 438/257–262, 294, 296, 524–526

(56) References Cited

U.S. PATENT DOCUMENTS

| | | | | |
|---|---|---|---|---|
| 6,103,574 A | * | 8/2000 | Iwasaki | 257/506 |
| 6,235,581 B1 | * | 5/2001 | Chen | 438/257 |
| 6,265,292 B1 | * | 7/2001 | Parat et al. | 438/434 |
| 6,306,737 B1 | * | 10/2001 | Mehrad et al. | 438/262 |
| 2002/0132425 A1 | * | 9/2002 | Song et al. | 438/257 |

\* cited by examiner

*Primary Examiner*—Hoai Ho
(74) *Attorney, Agent, or Firm*—LaRiviere, Grubman & Payne, LLP

(57) ABSTRACT

A low resistance common source line (12) for high performance NOR-type flash memories cells in different bit-lines but on the same word-line is used to reduce the memory core cell size and to improve the circuit density as the device dimensions are scaled down. For advanced flash memory technology where shallow trench isolation (STI) (4) is used, the common source formation (12) is facilitated by a VCI implant (11) performed before STI field oxide fill (5). The process sequence is to first form the trenches (4) for the subsequent STI (4), then apply the VCI mask (10) and perform the VCI high energy ion implant (11) to form the "future" source line (12). Then field oxide fill (5) is deposited into the STI trench (4) to form the desired field isolation structures and the memory circuit is completed using conventional techniques.

14 Claims, 6 Drawing Sheets

Invention

Invention

Invention

METHOD OF FORMING LOW RESISTANCE COMMON SOURCE LINE FOR FLASH MEMORY DEVICES

TECHNICAL FIELD

The present invention relates to the field of microelectronic circuit fabrication, more particularly to fabrication of flash memory microelectronic circuits, and even more particularly to a method for fabrication of an intermediate device containing a low resistance common source line for fabrication of flash memory microelectronic circuits.

BACKGROUND ART

High performance NOR-type flash memories require high density and high operating speed as the device dimensions are scaled down. A low resistance common source line for cells in different bit-lines, but on the same word-line, is used in flash memory devices to reduce memory core cell size and to improve circuit density.

Prior art advanced flash memory technology in which shallow trench isolation (STI) method is used in fabrication of memory core cells, requires a series of steps prior to fabrication of the low resistance common source line, including the steps of 1) forming shallow trenches in the chip substrate, 2) filling the shallow trenches with field oxide, 3) applying an SAS etch mask, 4) using SAS etch to remove field oxide fill from unprotected STI regions, 5) removing the damaged SAS etch mask, 6) applying a high energy ion implant mask, 7) forming a low resistance common source line by applying a high energy ion implant (Vss Core Implant (VCI), to the unprotected regions, 8) removing the VCI mask, and 9) filling the STI regions with field oxide. The remainder of the flash memory microelectronic circuitry, such as source and drain regions and gate structures are then conventionally formed.

The prior art method requires an SAS etch process be used to remove field oxide from the STI regions prior to formation of the low resistance common source line. SAS etch is an aggressive process, using a strong oxide etch that can damage tunnel oxide corners, oxide-nitride-oxide (ONO) layers, and the SAS etch mask, requiring replacement of the SAS mask before applying a new mask for VCI implant mask and forming the low resistance common source line. The SAS process is a multistep process which is inefficient and produces damage resulting in reduced wafer yield and reduced microchip reliability. What is needed is a simplified method for forming a higher quality low resistance common source line microelectronic structure, thereby increasing production efficiency by reducing fabrication steps and by reducing damage to gate structures, providing a higher production yield and cell reliability.

Specific details of the invention are included in the modes for carrying out the invention section and as described in the drawings and as claimed.

DISCLOSURE OF INVENTION

The present invention is a simplified method for forming an improved microelectronic component having a low resistance common source line for all devices on a different bit line and the same word-line of high performance NOR-type flash memory microelectronic circuits. For advanced flash memory technology where STI method is to be used in fabrication of flash memory core cells, the method of the present invention completely eliminates the use of SAS etch process, and, alternatively, uses only VCI mask and implant steps to produce a high energy ion implant to form a low resistance common source line for all cells on a different bit line and the same word-line. The method of the present invention eliminates the steps of 1) filling the shallow trenches with field oxide, 2) applying an SAS etch mask, 3) using SAS etch to remove field oxide fill from unprotected STI regions, and removing the damaged SAS etch mask. In the present invention, the VCI implant is performed after formation of shallow trenches and eliminates the need for field oxide fill, thus there is no need to use SAS etch since the low resistance common source line is formed prior to STI field oxide fill. The present invention method consists of the steps of 1) forming shallow trenches in the substrate, 2) applying a VCI mask, 3) applying a VCI implant thereby forming the low resistance common source line, 4) removing the VCI mask, 5) forming a liner oxide layer, and filling the shallow trench region with field oxide. The memory structure is then conventionally formed as is known in the art. Elimination of the SAS etch associated steps creates a simplified fabrication method resulting in more efficient fabrication. Further, elimination of the SAS etch associated steps avoids damage to the device surface by the SAS etch, resulting in higher fabrication yield. The present invention is useful for ever smaller cell sizes, in which fabrication using SAS etch becomes nearly impossible.

BRIEF DESCRIPTION OF THE DRAWINGS

For fuller understanding of the present invention, reference is made to the accompanying drawings. Reference numbers refer to the same or equivalent parts of the present invention throughout the several figures.

MODES FOR CARRYING OUT THE INVENTION

The present invention is a simplified method for formation of low resistance common source lines for all cells on a different bit line and the same word-line for advanced flash memory technology where shallow trench isolation (STI) is used, and the fabrication intermediate device which results. To better understand the present invention, reference is made to the accompanying drawings and the following brief discussion of the prior art.

Figure 1:
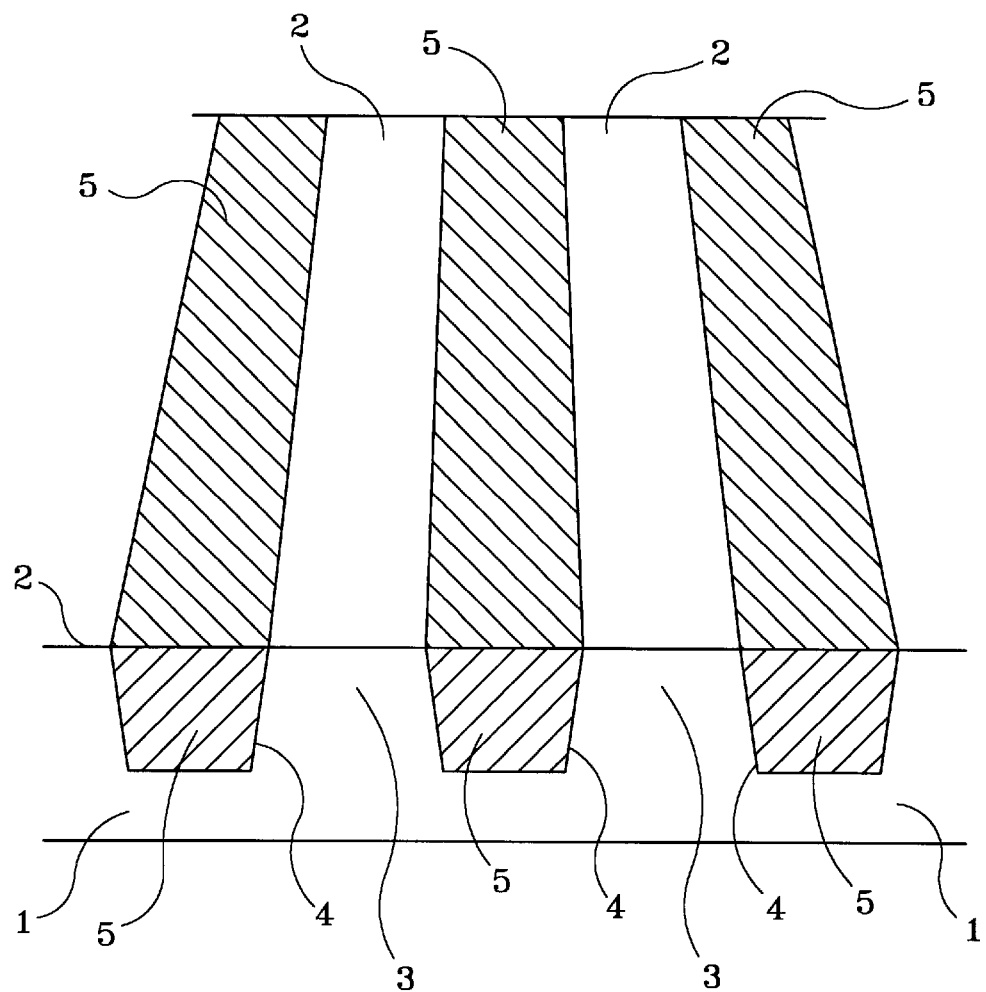
FIG. 1 is a perspective elevation view of a prior art substrate with active areas after formation of shallow trenches and after filling the trenches with field oxide.

Referring to FIG. 1, in the prior art, parallel shallow trenches 4 are formed by conventional means in substrate 1 comprising an upper surface area 2 and active areas 3. The shallow trenches 4 are filled with field oxide 5.

Figure 2:
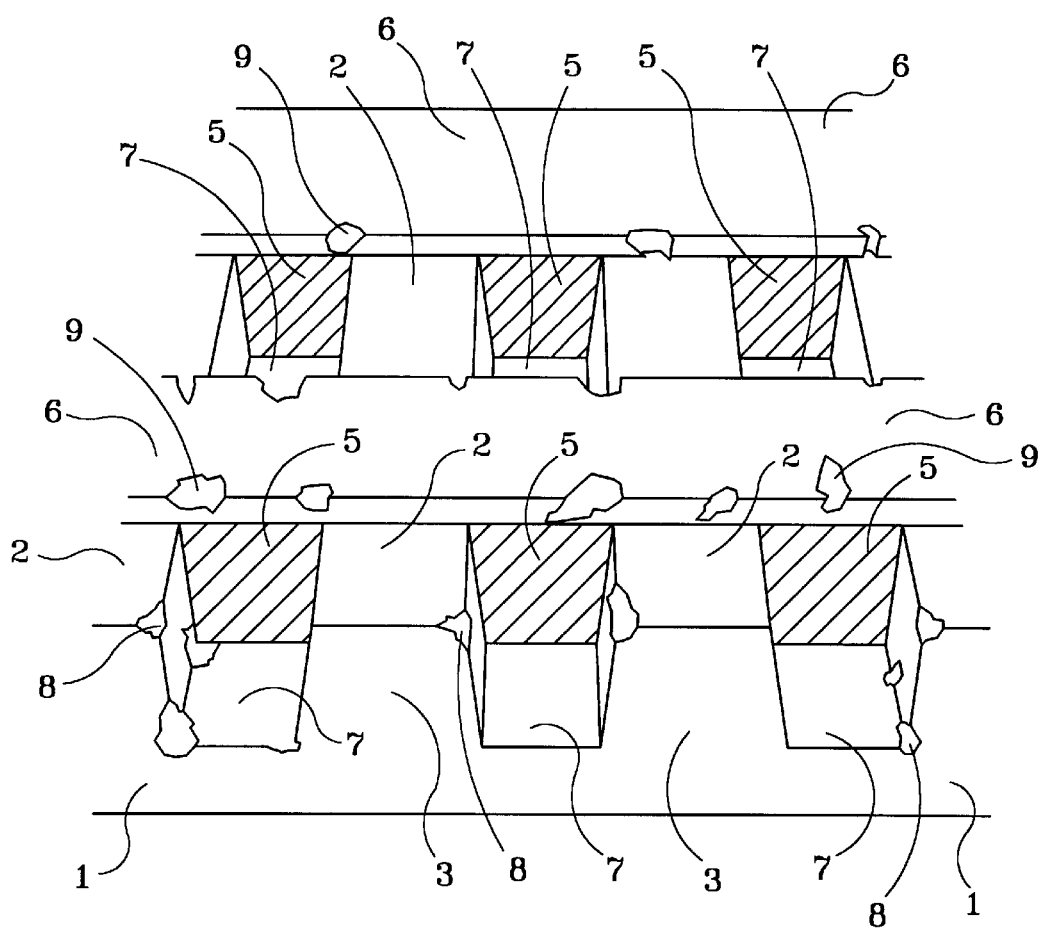
FIG. 2 is a perspective elevation view of the substrate of FIG. 1 after application of a SAS etch mask and after SAS etch process to remove field oxide forming shallow trench isolation regions, as in the prior art.

Referring to FIG. 2, in the prior art, an SAS etch mask 6 is applied in alternating bands or equivalent patterns to the substrate surface 2 in a direction perpendicular to the longitudinal direction of the shallow trenches 4. An SAS etch process is used to remove the field oxide 5 from the shallow trench regions 7 which are unprotected by SAS mask 6. The SAS etch process creates STI regions 7 which are devoid of field oxide fill 5 and are separated by regions of field oxide fill 5. SAS etch has removed the field oxide 5 and has damaged 8 substrate surfaces 2, active area surfaces 3, and STI 7 surfaces. Regions which field oxide 5 was not removed due to protection by SAS etch mask 6, shows SAS etch damage 9 to the SAS mask 6, requiring removal of the SAS mask before further processing is done.

Figure 3:
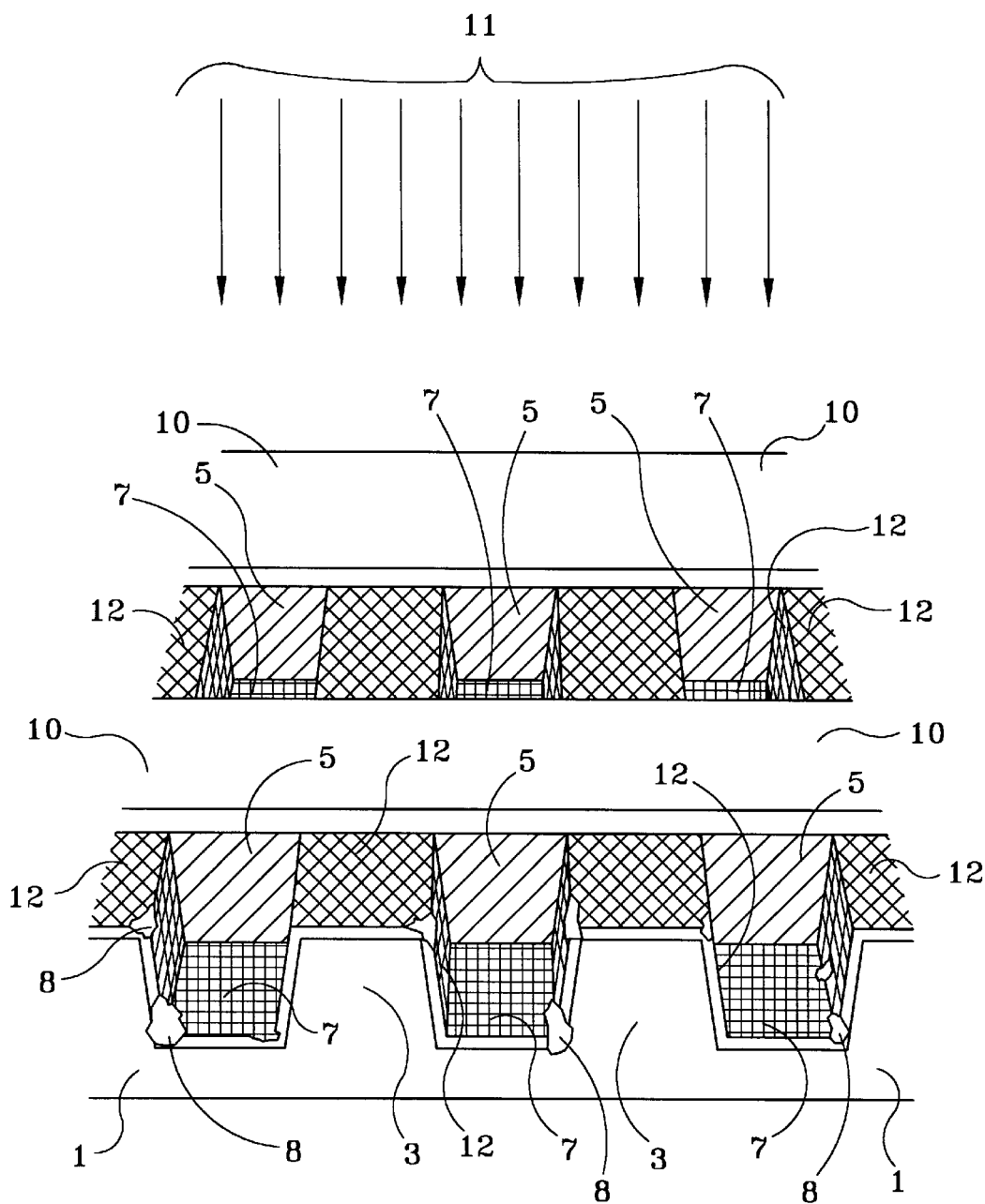
FIG. 3 is a perspective elevation view of the substrate of FIG. 2 after removal of the damaged SAS mask, after application of a VCI mask, showing VCI implant, and formation of a low resistance common source line, as in the prior art.

Referring to FIG. 3, in the prior art the SAS mask 6 is removed and a VCI mask 10 is formed over the regions from which field oxide 5 was not removed by SAS etch and the interconnecting substrate regions, leaving the STI 7 regions and the interconnecting regions exposed. A low resistance common source line 12 is formed in the unprotected regions by VCI implant 11 of arsenic, phosphorus or indium using an implant energy of about 40 keV to about 80 keV.

Figure 4:
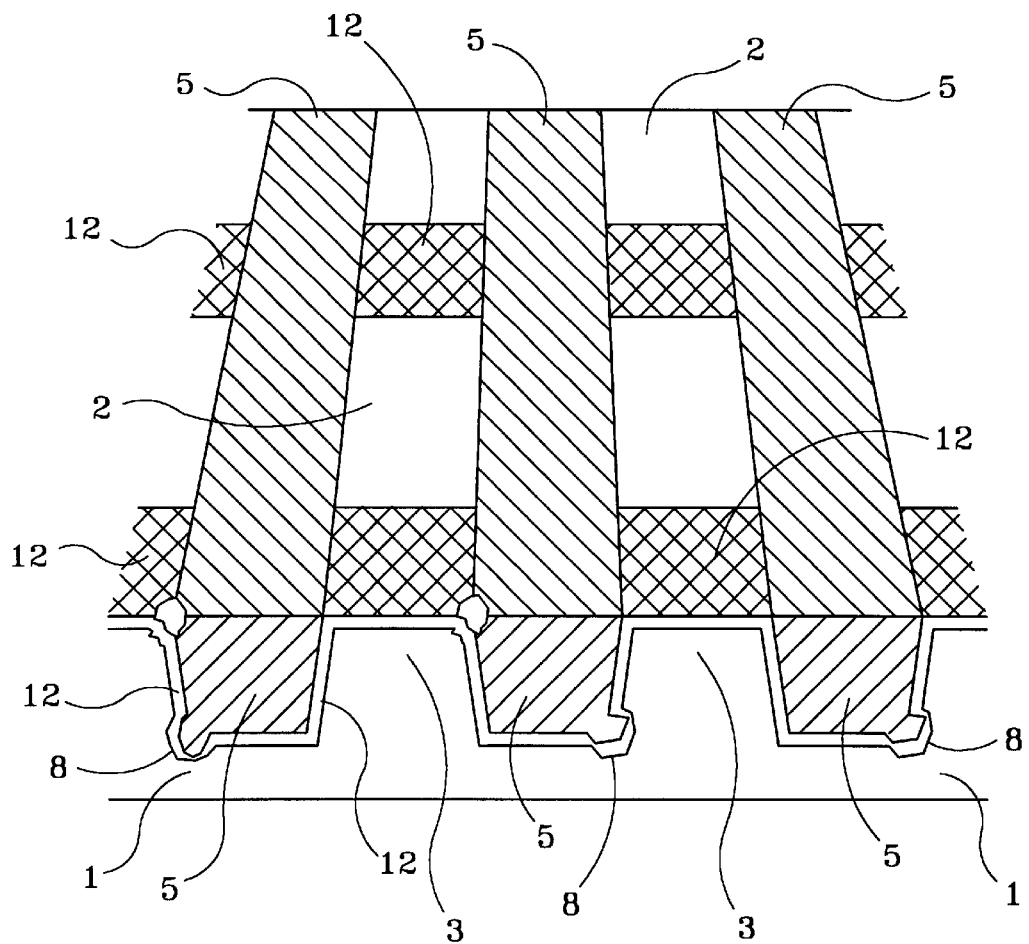
FIG. 4 is a perspective elevation view of the substrate of FIG. 3 after field oxide fill, as in the prior art.

Referring to FIG. 4, in the prior art the VCI mask 10 is removed and the STI regions 7 are filled with field oxide 5.

Figure 5:
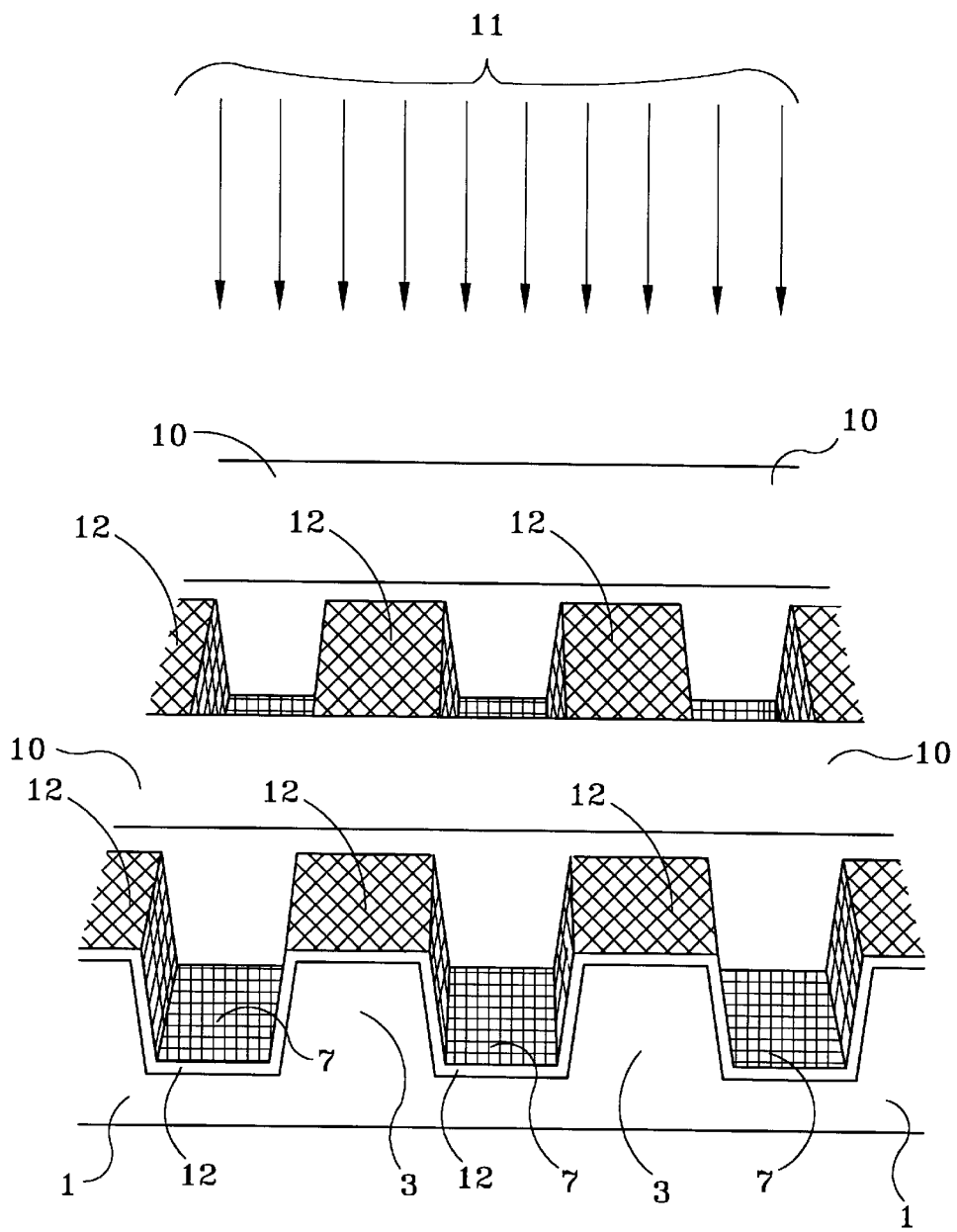
FIG. 5 is a perspective elevation view of the substrate of FIG. 5 with active areas after formation of shallow trenches; after application of a VCI mask, showing VCI implant and formation of a low resistance common source line according to the method of the present invention.

Referring to FIG. 5 in the method of the present invention, parallel shallow trenches 4 are formed by conventional means in a substrate 1 comprising an upper surface area 2 and active areas 3. A VCI mask 10 is applied in alternating bands or equivalent patterns to the substrate surface 2 in a direction perpendicular to the longitudinal direction of the shallow trenches 4. A low resistance common source line 12 then is formed in the unprotected regions by VCI implant 11 of arsenic, phosphorus or indium using implant energy of about 40 keV to about 80 keV.

Figure 6A:
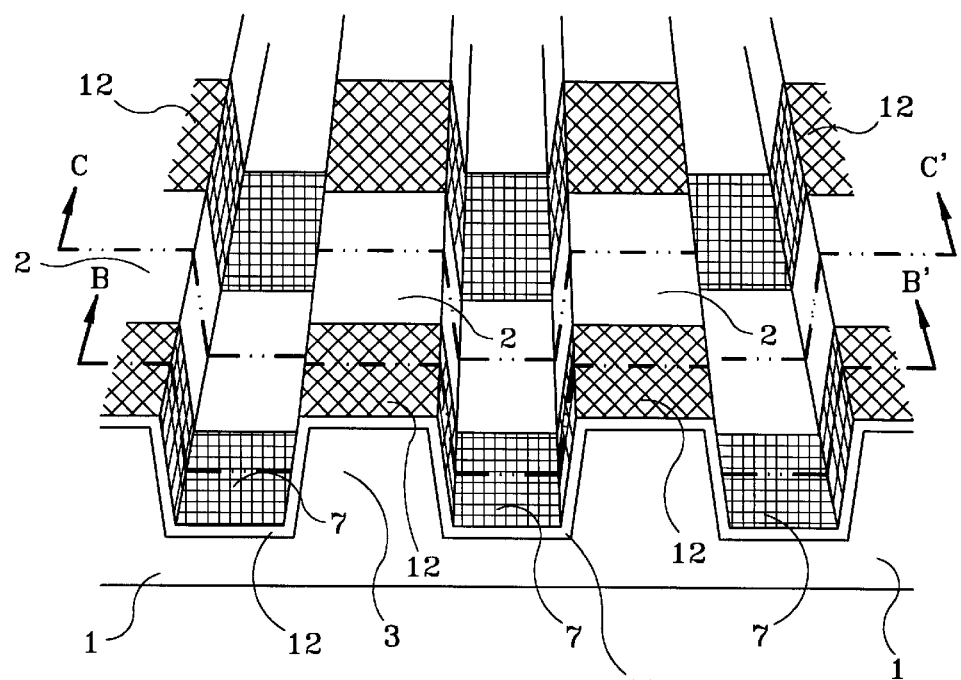
FIG. 6A is a perspective elevation view of the substrate of FIG. 7 after removal of the VCI mask and formation of a liner oxide according to the method of the present invention.
Figure 6B:
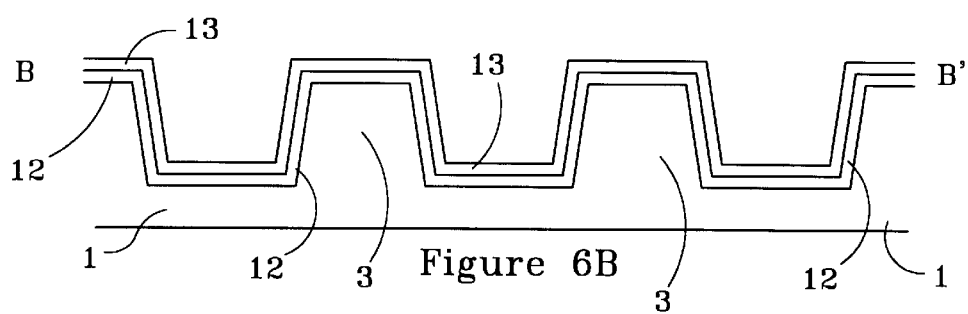
FIG. 6B and FIG. 6C are side view elevations of FIG. 6A taken along lines 6B–6B' and 6C–6C' in the method of the present invention, respectively showing deposition of a linear region of low resistance common source line covered with a layer of liner oxide, and a substrate region covered with a layer of liner oxide.
Figure 6C:
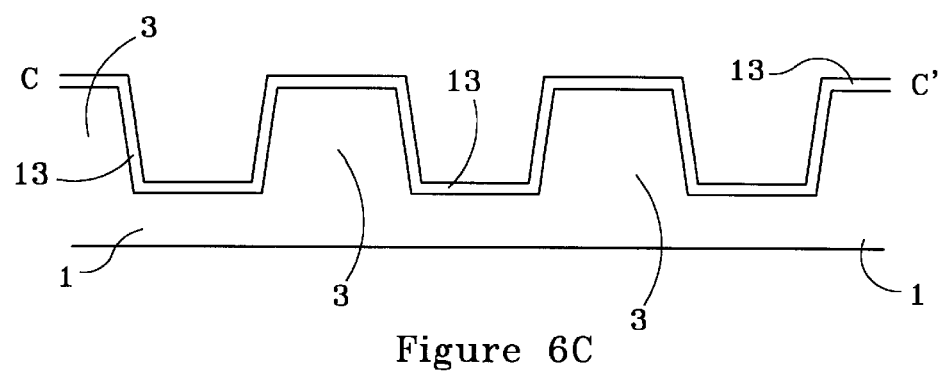

Referring to FIG. 6A in the method of the present invention, the VCI mask 10 is removed and the entire upper surface 2 of the substrate 1 is oxidized to form a liner oxide 13. FIG. 6B and FIG. 6C are side view elevations of FIG. 6A taken along lines 6B—6B' and 6C—6C' in the method of the present invention, respectively showing deposition of a linear region of low resistance common source line covered with a layer of liner oxide, and a substrate region covered with a layer of liner oxide. The remainder of the formation of the flash memory device then proceeds by conventional methods.

INDUSTRIAL APPLICABILITY

The present invention finds industrial applicability in the semiconductor fabrication industry. In particular, the present invention relates to industrial applicability in the flash memory device fabrication industry. More particularly, the present invention finds industrial applicability for the fabrication of intermediate devices containing a low resistance common source line.

SCOPE OF THE INVENTION

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more". All structural and functional equivalents to the elements of the above-described preferred embodiment and additional embodiments that are known to those of ordinary skill in the art are hereby expressly incorporated by reference and are intended to be encompassed by the present claims. Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, material, and fabrication detail may be made without departing from the spirit and scope of the inventions as set forth in the appended claims. No claim herein is to be construed under the provisions of 35 U.S.C. 112, sixth paragraph, unless the element is expressly recited using the phrase "means for".

What is claimed:
1. A method for fabricating a flash memory device, comprising:
   forming at least one shallow trench in a substrate;
   masking selected portions of said substrate using a mask to delineate at least one protected substrate region and at least one non-protected substrate region on said substrate, the at least one non-protected substrate region being oriented at a right angle to the at least one shallow trench; and
   implanting ions into said at least one non-protected substrate region thereby forming at least one low resistance common source line;
   wherein said at least one shallow trench being void of any field oxide.

2. The method as in claim 1 further comprising:

removing said mask and thereby exposing said at least one protected substrate region; and forming an oxide liner over said at least one low resistance common source line and over said at least one exposed protected substrate region.

3. The method as in claim 1 wherein said implanting step comprises implanting ions selected from a group consisting essentially of arsenic, phosphorous, and indium ions.

4. The method as in claim 1 wherein said implanting step comprises implanting ions at an implant energy within a range of approximately 40 keV to approximately 80 keV.

5. The method as in claim 2 further comprising:

depositing field oxide fill into said at least one shallow trench.

6. A method for fabricating a flash memory device, comprising:

forming at least one shallow trench in a substrate;

masking selected portions of said substrate using a mask to delineate at least one protected substrate region and at least one non-protected substrate region on said substrate, the at least one non-protected substrate region being oriented at right angles to the at least one shallow trench;

implanting ions into said at least one non-protected substrate region thereby forming at least one low resistance common source line;

removing said mask and thereby exposing said at least one protected substrate region; and forming an oxide liner over said at least one low resistance common source line and over said at least one exposed protected substrate region wherein said at least one shallow trench being void of any field oxide.

7. The method as in claim 6, wherein said implanting step comprises implanting ions selected from a group consisting essentially of arsenic, phosphorous, and indium ions.

8. The method as in claim 6, wherein said implanting step comprises implanting ions at an implant energy within a range of approximately 40 keV to approximately 80 keV.

9. The method as in claim 6 further comprising:

depositing field oxide fill into said at least one shallow trench.

10. A method for fabricating a flash memory device, comprising:

forming at least one shallow trench in a substrate;

masking selected portions of said substrate using a mask to delineate at least one protected substrate region and at least one non-protected substrate region on said substrate, the at least one non-protected substrate region being oriented at an angle to the at least one shallow trench;

implanting ions into said at least one non-protected substrate region thereby forming at least one low resistance common source line; and completing formation of the flash memory device.

11. The method as in claim 10 further comprising:

removing the mask and thereby exposing said at least one protected substrate region; and forming an oxide liner over said at least one low resistance common source line and over said at least one exposed protected substrate region.

12. The method as in claim 11, wherein said implanting step comprises implanting ions selected from a group consisting essentially of arsenic, phosphorous, and indium ions.

13. The method as in claim 12, wherein said implanting step comprises implanting ions at an implant energy within a range of approximately 40 keV to approximately 80 keV.

14. The method as in claim 10 further comprising depositing field oxide fill into said at least one shallow trench.

* * * * *